United States Patent
D'Angelo

(10) Patent No.: US 9,236,371 B2
(45) Date of Patent: *Jan. 12, 2016

(54) INTEGRATED CIRCUIT FOR CONTROLLING AN INDUCTIVE BOOST CONVERTER

(71) Applicant: ADVANCED ANALOGIC TECHNOLOGIES INCORPORATED, Santa Clara, CA (US)

(72) Inventor: Kevin D'Angelo, Santa Clara, CA (US)

(73) Assignee: ADVANCED ANALOGIC TECHNOLOGIES INCORPORATED, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/453,956

(22) Filed: Aug. 7, 2014

(65) Prior Publication Data

US 2014/0340063 A1    Nov. 20, 2014

Related U.S. Application Data

(63) Continuation of application No. 13/080,115, filed on Apr. 5, 2011, now Pat. No. 8,829,873.

(51) Int. Cl.
| | |
|---|---|
| G05F 1/40 | (2006.01) |
| H01L 27/02 | (2006.01) |
| G05F 3/26 | (2006.01) |
| H02M 3/158 | (2006.01) |
| G05F 1/46 | (2006.01) |

(52) U.S. Cl.
    CPC .......... *H01L 27/02* (2013.01); *G05F 3/262* (2013.01); *H02M 3/158* (2013.01); *G05F 1/46* (2013.01); *H01L 2227/00* (2013.01); *H01L 2229/00* (2013.01)

(58) Field of Classification Search
    CPC .......... G05F 3/16; G05F 3/262; G05F 1/461; G05F 1/462; G05F 1/465; G05F 1/565; G05F 1/575
    USPC .................. 323/222, 225, 268, 271, 282, 285
    See application file for complete search history.

(56) References Cited

U.S. PATENT DOCUMENTS

| | | | |
|---|---|---|---|
| 6,448,750 B1 | 9/2002 | Shor et al. | |
| 7,557,558 B2 | 7/2009 | Barrow | |
| 7,636,014 B1 | 12/2009 | Chen | |
| 2013/0235651 A1* | 9/2013 | Perner et al. | 365/148 |
| 2013/0285631 A1* | 10/2013 | Bisson et al. | 323/280 |
| 2015/0097541 A1* | 4/2015 | Banag | 323/281 |

* cited by examiner

*Primary Examiner* — Matthew Nguyen
(74) *Attorney, Agent, or Firm* — Lando & Anastasi, LLP

(57) ABSTRACT

An integrated circuit for controlling a boost converter. The integrated circuit includes a gate pin, a source pin, a feedback pin, a current mirror sub-circuit, and a control sub-circuit. The current mirror sub-circuit is connected to the source pin to produce an output current from a reference current flowing between the source pin and ground, the reference current being larger than the output current. The control sub-circuit is connected to the current mirror sub-circuit, the gate pin and the feedback pin to control a gate voltage provided to the gate pin based on the output current and a feedback voltage at the feedback pin.

37 Claims, 4 Drawing Sheets

INTEGRATED CIRCUIT FOR CONTROLLING AN INDUCTIVE BOOST CONVERTER

CROSS REFERENCE TO RELATED APPLICATIONS

This application claims priority under 35 U.S.C. §120 to U.S. application Ser. No. 13/080,115, titled "STEP DOWN CURRENT MIRROR FOR DC/DC BOOST CONVERTERS," filed Apr. 5, 2011, which is incorporated herein by reference in its entirety.

BACKGROUND OF THE INVENTION

One method used in modern, inductor based DC/DC boost converters to control the switching of power through the inductor utilizes a high current, low resistance, precision resistor. The resistor, shown in FIG. 1 as $R_{sense}$, is used to measure the current flowing through the inductor as the inductor is charging. The inclusion of this off-chip resistor as part of the DC/DC boost converter can be a significant part of the cost of the boost converter circuitry, and increases system complexity by imposing off-chip requirements on the manufacturer of the appliance rather than the more knowledgeable fabricator of the boost converter itself.

Generally, this precision resistor is not included as part of the integrated circuit that controls the converter. The low impedance of the resistor (in the neighborhood of 50 milliohms) makes its inclusion in such a chip problematic, as chip fabricators have difficulty fabricating a low resistance device with a high degree of required precision. The same requirement for precision also makes the installation of $R_{sense}$ into the enclosing appliance difficult, as careful traces are required in order to avoid instability in the DC/DC converter. As a result of these factors, the cost of both the resistor itself and assembling the resistor into the final product (the television that contains the DC/DC converter, for example) is high.

In addition, this topology often requires the appliance manufacturer to make use of a low pass filter to screen out the noise produced by the MOSFET (shown in FIG. 1 as $S_1$) as $S_1$ opens and closes. Without such filtering, the noise from the MOSFET can make it difficult to accurately read (and then process) the voltage across $R_{sense}$. With the added requirement of such filtering, there is additional cost in both the elements of the low pass filter and the careful assembly of these elements onto the circuit board of the appliance.

In addition, the use of the off-chip resistor requires the chip fabricator to execute modifications to compensate for any remaining noise within the PWM control loop. This becomes more problematic when it is understood that the in-circuit compensation is for an external element of the DC/DC converter circuitry, said element installed by the appliance manufacturer rather than the chip fabricator. These additional frequency components add design complexity and design cost to the boost converter circuitry.

While it is technically possible to put $S_1$ on the same substrate as the rest of the components, this is generally impractical because of its high voltage requirement and low resistance rating. The inclusion of this resultantly large switch within the same substrate as the remaining boost converter components would result in a higher cost per unit that can outweigh all of the other costs outlined previously. It is possible to package $S_1$ and the remaining components— manufactured on different substrates—in the same package, but this too is of negligible added benefit and would impose otherwise absent restrictions on the appliance manufacturer.

SUMMARY

The invention eliminates the need for an off chip, low resistance, high precision resistor used to sense current in high voltage boost converters. The circuit uses a current mirror to proportionally reduce the large current that runs through the switching MOSFET of a boost converter to a smaller current. This smaller current can then be manipulated in any one of a number of ways that can be implemented within a typical lower voltage CMOS process. For example, the smaller current can be measured with a higher resistance CMOS resistor included within a typical integrated circuit. The ability to trim these high resistance resistors during the manufacturing process allows for a high degree of precision in the final DC/DC converter integrated circuit. A refinement of that embodiment would involve a second current mirror, allowing the reference resistor to be referenced to ground.

In another embodiment, the actual current itself could be used, compared to the output of an "error operational transconductance amplifier" rather than the more standard operational amplifier. In this instance, the summation of these two currents could be used directly as the input to an oscillator that drives the MOSFET.

In addition, the invention's topology no longer requires that the voltage be measured on the high current connection immediately below the MOSFET. Because of this change, the MOSFET noise becomes less problematic, allowing for the elimination of the low pass (or other) noise filter. This lowers the appliance manufacturer's cost by eliminating the filter components and reducing the complexity of board fabrication.

The new topology is accurate because it is based on a ratio of two differently sized MOSFETs: a large MOSFET through which passes the reference current—the large inductor current—and a smaller MOSFET that determines the size of the output current. As a result, the ratio tracks over manufacturing process and appliance temperature variations, as both MOSFETs are created by the same instance of the manufacturing process and then used equivalently with the same wiring scheme and the identical gate voltages.

DETAILED DESCRIPTION

Figure 1:
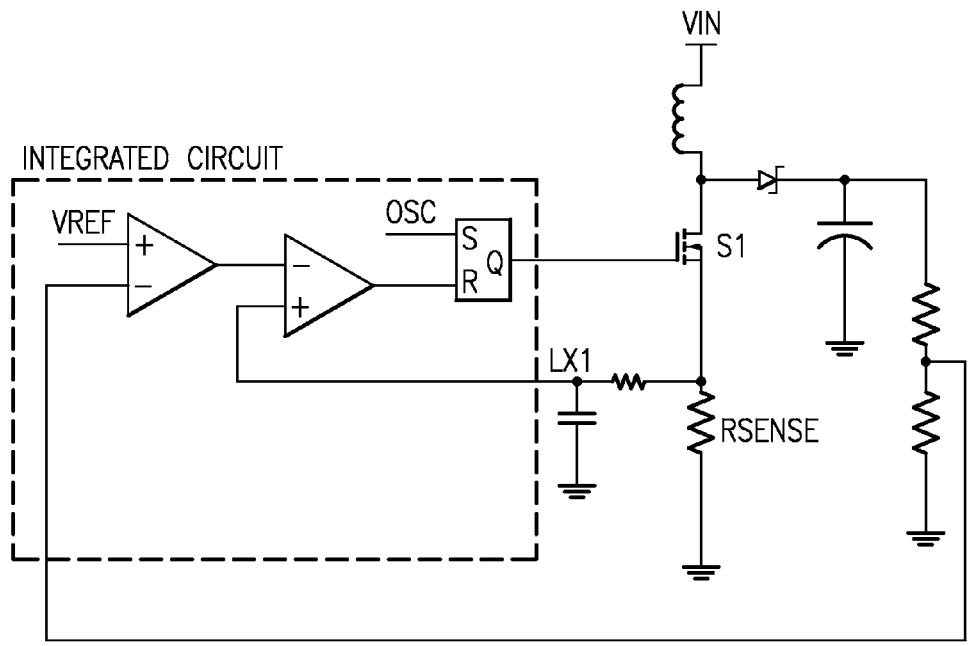
FIG. 1 is a schematic of a prior art boost converter with an external sense resistor.
Figure 2:
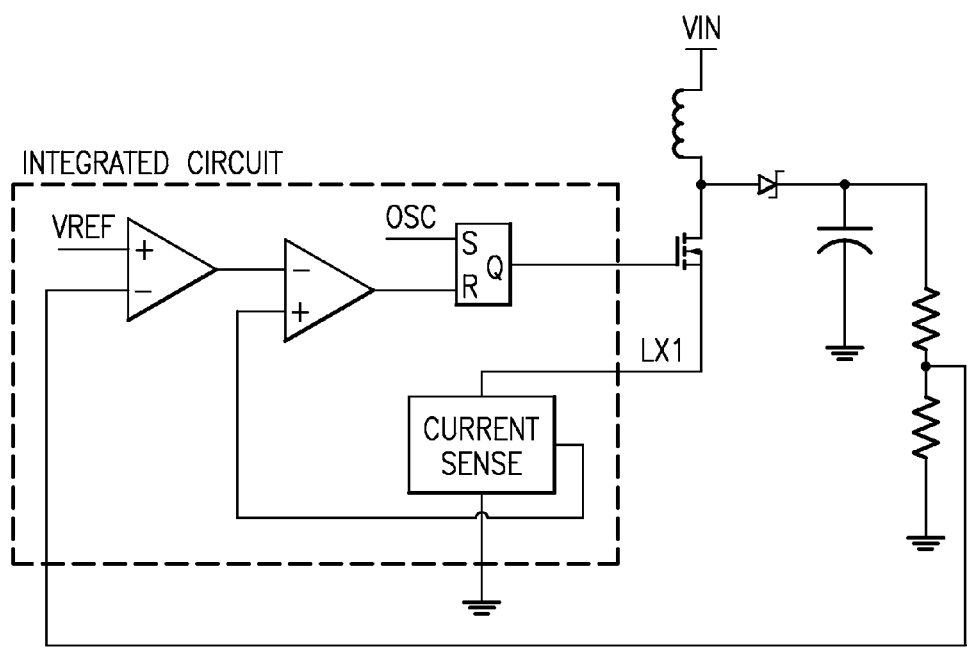
FIG. 2 is a schematic of a boost converter utilizing the integrated current sense invention.
Figure 3:
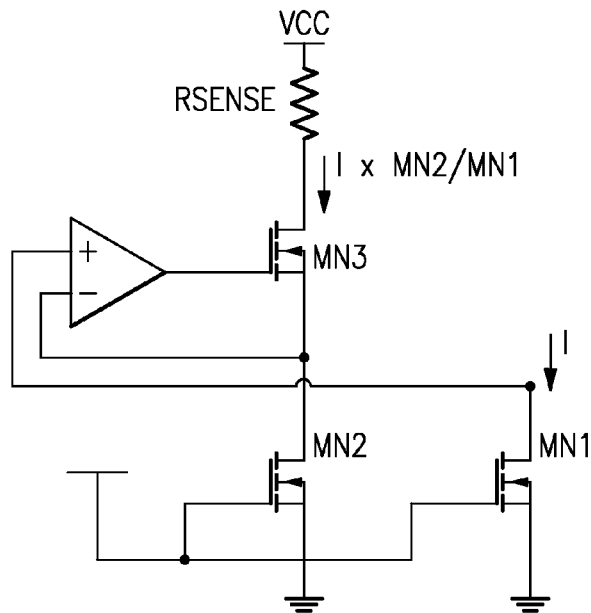
FIG. 3 is a schematic of the invention utilizing a current mirror and an integrated sense resistor.

FIG. 3 shows the construction of one embodiment of the invention as a combination of a current mirror and an integrated sense resistor. In many current mirror applications, the object is one of multiplying a desired current upward—using a small current to drive a large current. Here, the goal is the reverse—the invention uses a large current to derive a small current. In this example, noting that the voltages applied to the gates of the MOSFETs MN1 and MN2 are the same, and that the operational amplifier ensures that the voltages across the drains of MN1 and MN2 are also equivalent, the ratio of the currents through the MN1 and MN2 is simply a ratio of the sizes of MN1 and MN2 to each other, where the size of each is its width divided by its length.

In this current mirror, the operational amplifier finds the correct current through MN2 by altering the gate voltage of MN3. When the correct gate voltage of MN3 is found such that the voltages above MN1 and MN2 are equivalent, the size of the output current can be found by measuring the voltage across the known resistor $R_{sense}$.

Figure 4:
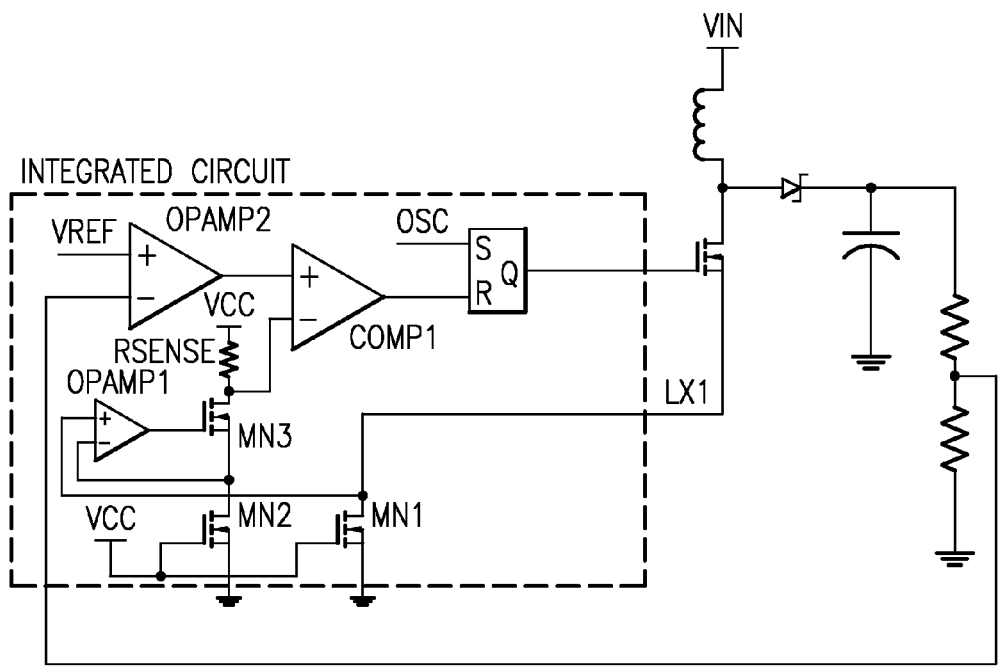
FIG. 4 is a schematic of an embodiment of the invention integrated into a boost converter.

FIG. 4 shows the inclusion of the integrated sense resistor circuit into the larger circuit of a boost converter. This figure shows the original location of $R_{sense}$, with its voltage referenced to a voltage source. An alternate circuit would change the resistor's reference from the voltage source to ground by utilizing the alternate embodiment (with the second current mirror) described above.

Figure 5:
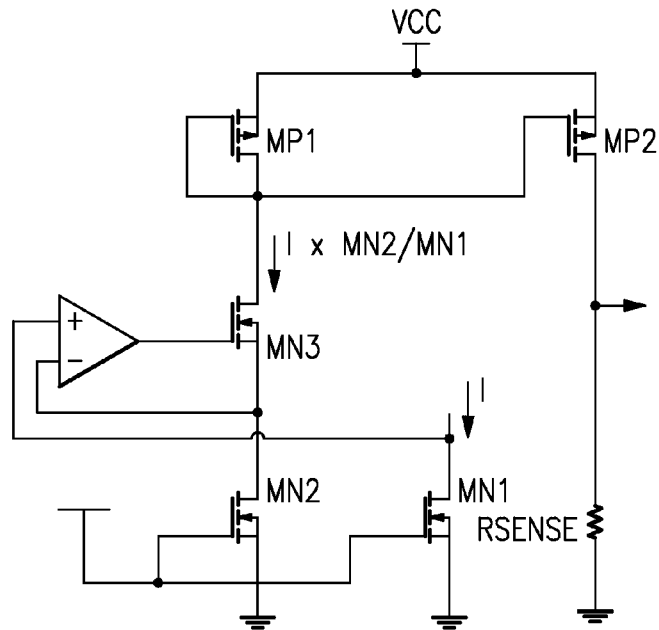
FIG. 5 is a schematic of a second embodiment of the invention using a second current mirror.

One inconvenience with this first embodiment of the invention is that the voltage across $R_{sense}$ is not referenced to ground; rather, it is referenced to a voltage source. This inconvenience can be alleviated with the addition of a second current mirror, shown in FIG. 5. This simpler current mirror reflects the "first produced" current (shown as I.times.MN2/MN1) into a "second produced" current that flows through a relocated $R_{sense}$ resistor that is referenced to ground. Other than the difference voltage references, the two circuits function similarly.

Figure 6:
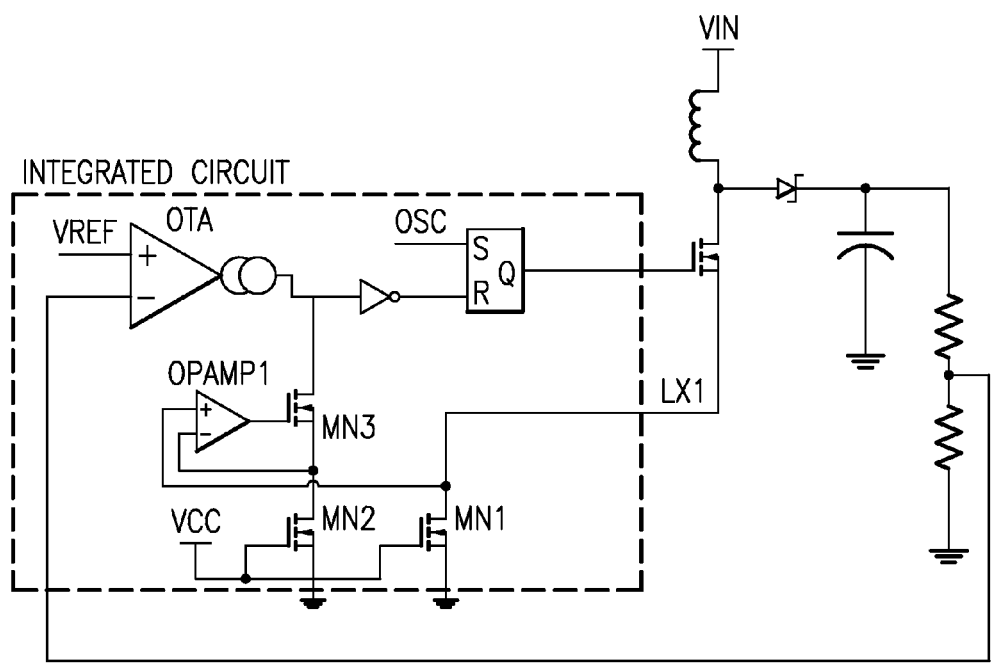
FIG. 6 is a schematic of a third embodiment of the invention using an operational transconductance amplifier.

Another embodiment of the invention utilizes directly the output current of the current mirror. Consider a boost converter in which the error element is an operational transconductance amplifier rather than the more standard operational amplifier. In this instance, the summation of the two currents—one from the OTA and the other from the current mirror—could be used directly as the input to an oscillator that drives the MOSFET. FIG. 6 shows how this current summation methodology could be implemented inside of a boost converter.

Figure 7:
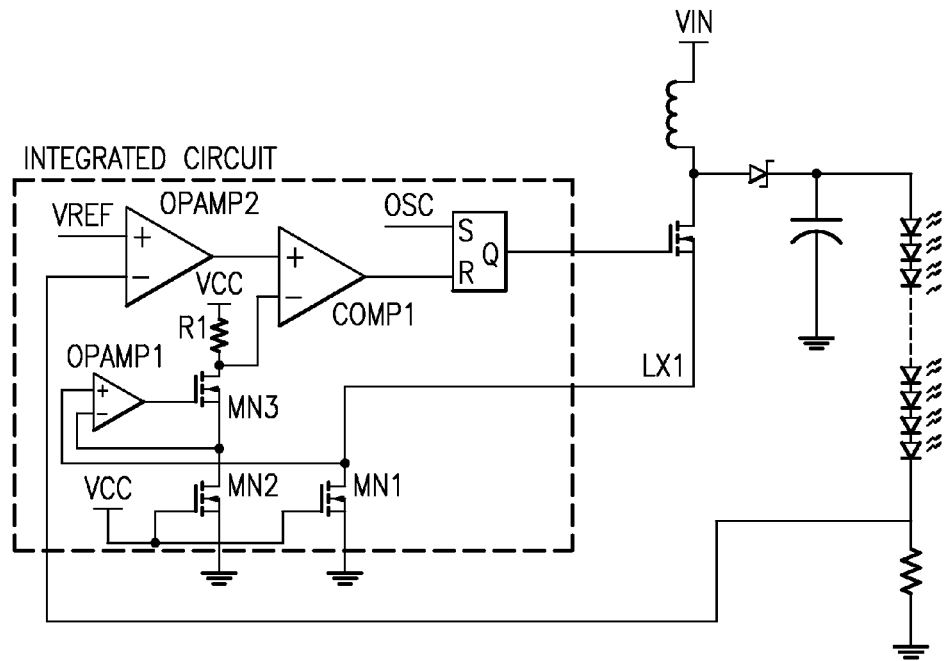
FIG. 7 is a schematic of an embodiment of the invention driving a single string of LEDs.

FIG. 7 shows an embodiment of the invention as it would appear in an enclosing appliance, in this case a small screen as part of a laptop computer. The screen is composed of 1 string of 10 LEDs. The 10 LED segment would have a forward voltage of about 35 volts. Each LED requires about 0.1 amps to produce the correct amount and color of light, implying that the resistor at the front of the LED string to ground sees about 0.1 amps. If we want an ideal measurement across the resistor to be 1.2 volts, the resistance is then imputed using R=V/I, or 12 ohms.

Figure 8:
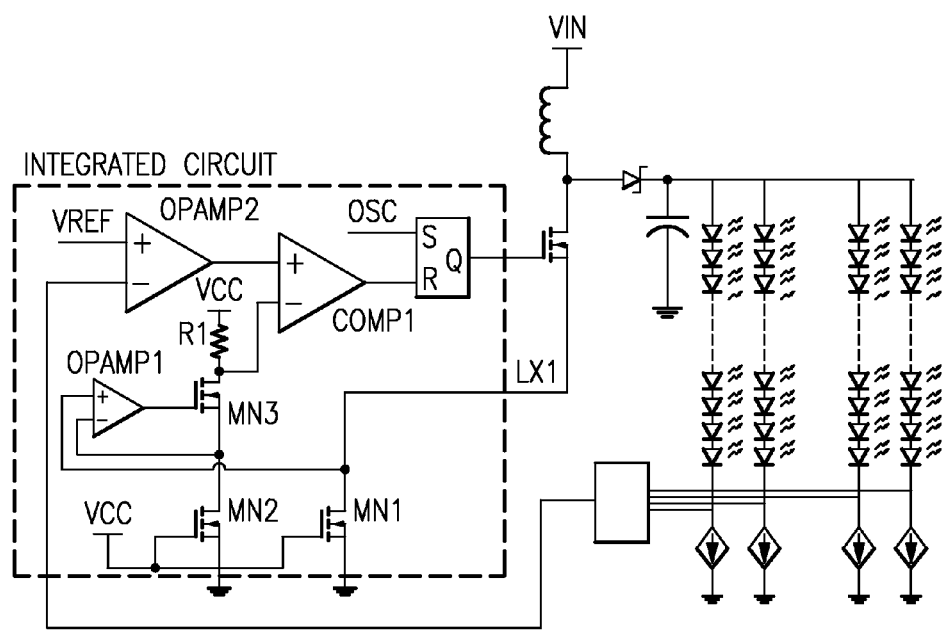
FIG. 8 is a schematic of an embodiment of the invention driving multiple strings of LEDs.

FIG. 8 shows a second embodiment of the invention as it would appear in a more complex appliance—a television with an LED backlight. In this example, the individual strings of LEDs (there could be multiple dozens of strings, or even more) are each controlled by individual current sinks. (The current sinks are controlled by a separate controller part of the television.) In order for the current sinks to function, they must have access to 1.2 volts. The black box in the drawing, which may be one IC or a series of ICs, takes as inputs the voltages above the current sinks and returns the single lowest voltage as its output, ensuring enough current for all of the strings by ensuring a minimal voltage across each of the current sinks.

What is claimed is:

1. An integrated circuit for controlling a boost converter, the integrated circuit comprising:
   a gate pin;
   a source pin;
   a feedback pin;
   a current mirror sub-circuit, connected to the source pin, to produce an output current from a reference current flowing between the source pin and ground, the reference current being larger than the output current; and
   a control sub-circuit connected to the current mirror sub-circuit, the gate pin, and the feedback pin to control a gate voltage provided to the gate pin based on the output current and a feedback voltage at the feedback pin.

2. The integrated circuit of claim 1 wherein the current mirror sub-circuit includes a first MOSFET and a second MOSFET each having a gate, a source, and a drain, the drain of the first MOSFET being connected to the source pin, the source of the first and second MOSFETs being connected to ground, and the gate of the first MOSFET being connected to the gate of the second MOSFET, the first MOSFET being larger than the second MOSFET.

3. The integrated circuit of claim 2 wherein the control sub-circuit includes a resistor through which the output current from the first current mirror sub-circuit flows, the control sub-circuit using a voltage across the resistor to control the gate voltage.

4. The integrated circuit of claim 3 wherein the current mirror sub-circuit further includes:
   a third MOSFET having a gate, a source, and a drain, the drain of the third MOSFET being connected to the resistor, and a source of the third MOSFET being connected to the drain of the second MOSFET; and
   an operational amplifier having a first input connected to the drain of the first MOSFET, a second input connected to the drain of the second MOSFET and an output connected to the gate of the third MOSFET.

5. The integrated circuit of claim 4 wherein the resistor, the first MOSFET, the second MOSFET, and the third MOSFET are fabricated on a same substrate.

6. The integrated circuit of claim 4 wherein the operational amplifier is a first operational amplifier and the control sub-circuit further includes:
   a second operational amplifier having a first input to connect to a reference voltage and a second input connected to the feedback pin; and
   a comparator having a first input connected to an output of the second operational amplifier and a second input connected to the drain of the third MOSFET and the resistor.

7. The integrated circuit of claim 6 wherein the resistor, the first MOSFET, the second MOSFET, the third MOSFET, the first operational amplifier, the second operational amplifier, and the comparator are fabricated on a same substrate.

8. The integrated circuit of claim 2 wherein the current mirror sub-circuit further includes:
   a third MOSFET having a gate, a source, and a drain, the source of the third MOSFET being connected to the drain of the second MOSFET; and
   an operational amplifier having a first input connected to the drain of the first MOSFET, a second input connected to the drain of the second MOSFET and an output connected to the gate of the third MOSFET.

9. The integrated circuit of claim 8 wherein the control sub-circuit further includes an operational transconductance amplifier having a first input to connect to a reference voltage, a second input connected to the feedback pin, and an output connected to the drain of the third MOSFET.

10. An integrated circuit for controlling a boost converter, the integrated circuit comprising:
a gate pin;
a source pin;
a feedback pin;
a first current mirror sub-circuit, connected to the source pin, to produce a first output current from a reference current flowing between the source pin and ground, the reference current being larger than the first output current;
a second current mirror sub-circuit to produce a second output current from the first output current; and
a control sub-circuit connected to the second current mirror sub-circuit, the gate pin, and the feedback pin to control a gate voltage provided to the gate pin based on the second output current and a feedback voltage at the feedback pin.

11. The integrated circuit of claim 10 wherein the first current mirror sub-circuit includes a first MOSFET and a second MOSFET each having a gate, a source, and a drain, the drain of the first MOSFET being connected to the source pin, the source of the first and second MOSFETs being connected to ground, and the gate of the first MOSFET being connected to the gate of the second MOSFET, the first MOSFET being larger than the second MOSFET.

12. The integrated circuit of claim 11 wherein the first current mirror sub-circuit further includes:
a third MOSFET having a gate, a source, and a drain, the source of the third MOSFET being connected to the drain of the second MOSFET; and
an operational amplifier having a first input connected to the drain of the first MOSFET, a second input connected to the drain of the second MOSFET and an output connected to the gate of the third MOSFET.

13. The integrated circuit of claim 12 wherein the control sub-circuit includes a resistor through which the second output current flows, the control sub-circuit using a voltage across the resistor to control the gate voltage.

14. The integrated circuit of claim 13 wherein the second current mirror sub-circuit includes:
a fourth MOSFET and a fifth MOSFET each having a gate, a source, and a drain, the gate of the fourth MOSFET being connected to the gate of the fifth MOSFET, the drain of the fourth MOSFET, and the drain of the third MOSFET, the source of the fourth and fifth MOSFETs being configured to connect to a supply voltage, and the drain of the fifth MOSFET being connected to the resistor.

15. The integrated circuit of claim 14 wherein the resistor, the first MOSFET, the second MOSFET, the third MOSFET, the fourth MOSFET, and the fifth MOSFET are fabricated on a same substrate.

16. The integrated circuit of claim 14 wherein the operational amplifier is a first operational amplifier and the control sub-circuit further includes:
a second operational amplifier having a first input to connect to a reference voltage and a second input connected to the feedback pin; and
a comparator having a first input connected to an output of the second operational amplifier and a second input connected to the drain of the fifth MOSFET and the resistor.

17. A method of regulating an output voltage of a boost converter that includes an inductor coupled to a switching MOSFET, the method comprising:
sensing a current flowing in the inductor during charging of the inductor;
mirroring the current flowing in the inductor to a smaller output current; and
controlling the switching MOSFET to alternately charge and discharge the inductor based on the smaller output current.

18. The method of claim 17 further comprising:
generating a feedback voltage based on an output voltage of the boost converter;
converting the smaller output current to a sensed voltage; and
comparing the sensed voltage and the feedback voltage to control the switching MOSFET.

19. The method of claim 18 wherein sensing the current, mirroring the current, converting the smaller output current, and comparing the sensed voltage and the feedback voltage to control the switching MOSFET are performed in a single integrated circuit that is distinct from the inductor and the switching MOSFET.

20. The method of claim 17 wherein mirroring the current flowing in the inductor to a smaller output current includes:
mirroring, in a first current mirror, the current flowing in the inductor to a first current that is smaller than the current flowing in the inductor; and
mirroring, in a second current mirror that is distinct from the first current mirror, the first current to the smaller output current.

21. An integrated circuit for controlling a boost converter that includes an inductor coupled to a drain of a switching MOSFET, the integrated circuit comprising:
a gate pin to couple to a gate of the switching MOSFET;
a source pin to couple to a source of the switching MOSFET;
a current mirror sub-circuit to produce an output current from a reference current flowing between the source pin and ground during charging of the inductor, the reference current being larger than the output current; and
a control sub-circuit connected to the current mirror sub-circuit and the gate pin to control the switching MOSFET based on the output current.

22. The integrated circuit of claim 21 wherein the current mirror sub-circuit includes a first MOSFET and a second MOSFET each having a gate, a source, and a drain, the drain of the first MOSFET being connected to the source pin, the source of the first and second MOSFETs being connected to ground, and the gate of the first MOSFET being connected to the gate of the second MOSFET, the first MOSFET being larger than the second MOSFET.

23. The integrated circuit of claim 22 wherein the control sub-circuit includes a resistor through which the output current from the first current mirror sub-circuit flows, the control sub-circuit using a voltage across the resistor to control a gate voltage provided to the gate of the switching MOSFET.

24. The integrated circuit of claim 23 wherein the current mirror sub-circuit further includes:
a third MOSFET having a gate, a source, and a drain, the drain of the third MOSFET being connected to the resistor, and a source of the third MOSFET being connected to the drain of the second MOSFET; and
an operational amplifier having a first input connected to the drain of the first MOSFET, a second input connected to the drain of the second MOSFET and an output connected to the gate of the third MOSFET.

25. The integrated circuit of claim 24 wherein the resistor, the first MOSFET, the second MOSFET, and the third MOSFET are fabricated on a same substrate.

26. The integrated circuit of claim 24 further comprising a feedback pin to couple to an output of the boost converter.

27. The integrated circuit of claim 26 wherein the operational amplifier is a first operational amplifier and the control sub-circuit further includes:
- a second operational amplifier having a first input to connect to a reference voltage and a second input connected to the feedback pin; and
- a comparator having a first input connected to an output of the second operational amplifier and a second input connected to the drain of the third MOSFET and the resistor.

28. The integrated circuit of claim 22 wherein the current mirror sub-circuit further includes:
- a third MOSFET having a gate, a source, and a drain, the source of the third MOSFET being connected to the drain of the second MOSFET; and
- an operational amplifier having a first input connected to the drain of the first MOSFET, a second input connected to the drain of the second MOSFET and an output connected to the gate of the third MOSFET.

29. The integrated circuit of claim 28 further comprising a feedback pin to couple to an output of the boost converter, wherein the control sub-circuit further includes an operational transconductance amplifier having a first input to connect to a reference voltage, a second input connected to the feedback pin, and an output connected to the drain of the third MOSFET.

30. An integrated circuit for controlling a boost converter that includes an inductor coupled to a drain of a switching MOSFET, the integrated circuit comprising:
- a gate pin to couple to a gate of the switching MOSFET;
- a source pin to couple to a source of the switching MOSFET;
- a first current mirror sub-circuit to produce a first output current from a reference current flowing between the source pin and ground during charging of the inductor, the reference current being larger than the first output current;
- a second current mirror sub-circuit to produce a second output current from the first output current; and
- a control sub-circuit connected to the first current mirror sub-circuit, the second current mirror sub-circuit, and the gate pin to control the switching MOSFET based on the second output current.

31. The integrated circuit of claim 30 wherein the first current mirror sub-circuit includes a first MOSFET and a second MOSFET each having a gate, a source, and a drain, the drain of the first MOSFET being connected to the source pin, the source of the first and second MOSFETs being connected to ground, and the gate of the first MOSFET being connected to the gate of the second MOSFET, the first MOSFET being larger than the second MOSFET.

32. The integrated circuit of claim 31 wherein the first current mirror sub-circuit further includes:
- a third MOSFET having a gate, a source, and a drain, the source of the third MOSFET being connected to the drain of the second MOSFET; and
- an operational amplifier having a first input connected to the drain of the first MOSFET, a second input connected to the drain of the second MOSFET and an output connected to the gate of the third MOSFET.

33. The integrated circuit of claim 32 wherein the control sub-circuit includes a resistor through which the second output current flows, the control sub-circuit using a voltage across the resistor to control a gate voltage provided to the gate of the switching MOSFET.

34. The integrated circuit of claim 33 wherein the second current mirror sub-circuit includes:
- a fourth MOSFET and a fifth MOSFET each having a gate, a source, and a drain, the gate of the fourth MOSFET being connected to the gate of the fifth MOSFET, the drain of the fourth MOSFET, and the drain of the third MOSFET, the source of the fourth and fifth MOSFETs being configured to connect to a supply voltage, and the drain of the fifth MOSFET being connected to the resistor.

35. The integrated circuit of claim 34 wherein the resistor, the first MOSFET, the second MOSFET, the third MOSFET, the fourth MOSFET, and the fifth MOSFET are fabricated on a same substrate.

36. The integrated circuit of claim 34 further comprising a feedback pin to couple to an output of the boost converter.

37. The integrated circuit of claim 36 wherein the operational amplifier is a first operational amplifier and the control sub-circuit further includes:
- a second operational amplifier having a first input to connect to a reference voltage and a second input connected to the feedback pin; and
- a comparator having a first input connected to an output of the second operational amplifier and a second input connected to the drain of the fifth MOSFET and the resistor.

* * * * *